(12) United States Patent
Munezane (10) Patent No.: US 11,598,019 B2
(45) Date of Patent: Mar. 7, 2023

(54) CRUCIBLE-SUPPORTING PEDESTAL, QUARTZ CRUCIBLE-SUPPORTING DEVICE, AND METHOD FOR PRODUCING SILICON SINGLE CRYSTAL

(71) Applicant: SUMCO CORPORATION, Tokyo (JP)

(72) Inventor: Kenji Munezane, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 157 days.

(21) Appl. No.: 16/649,282

(22) PCT Filed: May 31, 2018

(86) PCT No.: PCT/JP2018/021026
§ 371 (c)(1),
(2) Date: Mar. 20, 2020

(87) PCT Pub. No.: WO2019/064697
PCT Pub. Date: Apr. 4, 2019

(65) Prior Publication Data
US 2020/0283925 A1    Sep. 10, 2020

(30) Foreign Application Priority Data
Sep. 29, 2017   (JP) .............................. JP2017-191553

(51) Int. Cl.
*C30B 15/10*   (2006.01)
*C30B 29/06*   (2006.01)

(52) U.S. Cl.
CPC .............. *C30B 15/10* (2013.01); *C30B 29/06* (2013.01)

(58) Field of Classification Search
CPC ................................ C30B 15/10; C30B 29/06
See application file for complete search history.

(56) References Cited

U.S. PATENT DOCUMENTS

| | | | |
|---|---|---|---|
| 2002/0170492 A1 | 11/2002 | Kubo et al. | |
| 2006/0016389 A1* | 1/2006 | Holder | C30B 15/10 117/200 |
| 2006/0236916 A1* | 10/2006 | Ohama | C30B 29/06 117/200 |

FOREIGN PATENT DOCUMENTS

| | | |
|---|---|---|
| CN | 201058841 Y | 5/2008 |
| CN | 202030857 U | 11/2011 |

(Continued)

OTHER PUBLICATIONS

Office Action issued in Taiwanese Patent App. No. 107119815 dated Apr. 8, 2019, English translation.

(Continued)

*Primary Examiner* — Hua Qi
(74) *Attorney, Agent, or Firm* — Greenblum & Bernstein, P.L.C.

(57) ABSTRACT

A crucible-supporting pedestal includes a fitting recess portion into which a divided graphite member is fittable. An opening edge of the fitting recess portion is formed such that a contact area between the opening edge and the divided graphite member is provided at a position higher than a surface of a solidified product of a silicon melt which remains in a quartz crucible after a silicon single crystal is grown, and a force, which is applied to the divided graphite member by an expansion of the silicon melt when the silicon melt is solidified, is applied to a position lower than the contact area.

16 Claims, 5 Drawing Sheets

(56) References Cited

FOREIGN PATENT DOCUMENTS

| | | | |
|---|---|---|---|
| CN | 202830218 U | | 3/2013 |
| CN | 103189547 A | | 7/2013 |
| CN | 205803631 U | | 12/2016 |
| JP | 58-121377 U | | 8/1983 |
| JP | H01-142463 U | | 9/1989 |
| JP | 7-25694 A | | 1/1995 |
| JP | 9-77589 A | | 3/1997 |
| JP | 2000016893 A | * | 1/2000 |
| JP | 2000-264777 A | | 9/2000 |
| JP | 2002-154892 A | | 5/2002 |
| JP | 2002-274991 A | | 9/2002 |
| TW | M548702 U | | 9/2017 |

OTHER PUBLICATIONS

ISR issued in WIPO Patent Application No. PCT/JP2018/021026, dated Jul. 31, 2018, English translation.
IPRP issued in WIPO Patent Application No. PCT/JP2018/021026, dated Mar. 31, 2020, English translation.
Office Action issued in CN Patent Application No. 201880062777.7, dated May 19, 2021, English translation.

* cited by examiner

CRUCIBLE-SUPPORTING PEDESTAL, QUARTZ CRUCIBLE-SUPPORTING DEVICE, AND METHOD FOR PRODUCING SILICON SINGLE CRYSTAL

TECHNICAL FIELD

The present invention relates to a crucible-supporting pedestal, a quartz crucible-supporting device, and a method for producing a silicon single crystal.

BACKGROUND ART

In the related art, there is known a quartz crucible-supporting device that is used in producing a silicon single crystal by the Czochralski process, and supports a quartz crucible (for example, refer to Patent Literature 1).

Figure 4A:
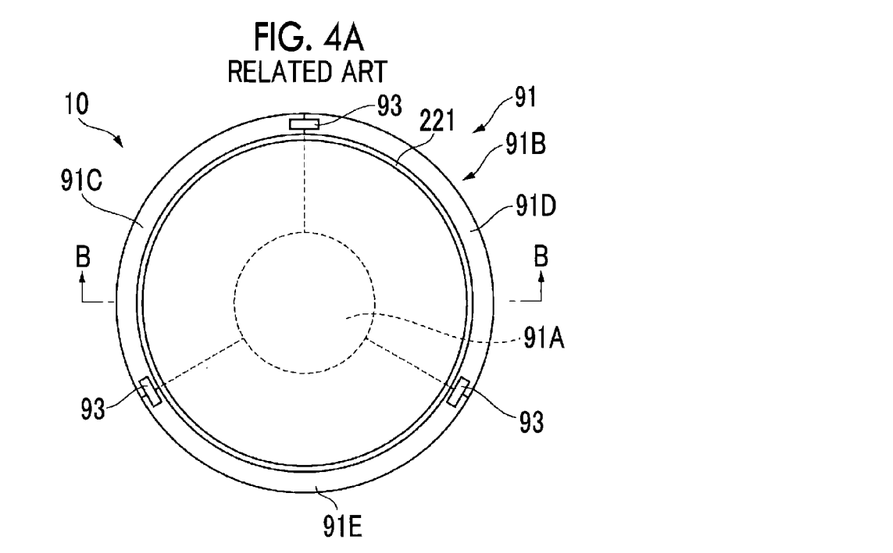
FIG. 4A is a plan view of a quartz crucible-supporting device in the related art.
Figure 4B:
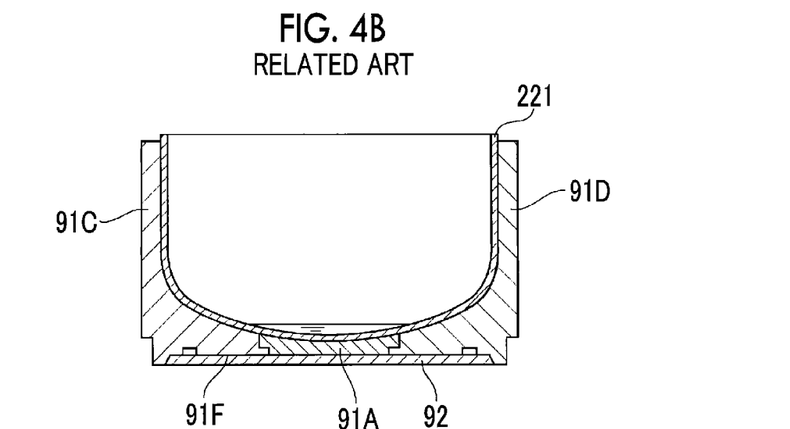
FIG. 4B is a cross-sectional view showing the quartz crucible-supporting device in the related art, which is taken along the line B-B in FIG. 4A.

As shown in FIGS. 4A and 4B, a quartz crucible-supporting device disclosed in Patent Literature 1 includes a graphite crucible 91 which supports a quartz crucible 221, and a crucible-supporting pedestal 92 made of graphite which supports the graphite crucible 91.

The graphite crucible 91 is formed of a bottom portion 91A with a disc shape and a side portion 91B in addition thereto. The side portion 91B is formed of a first divided graphite member 91C, a second divided graphite member 91D, and a third divided graphite member 91E which are obtained by vertically dividing the side portion 91B into three equal parts.

A recess portion 91F into which the crucible-supporting pedestal 92 is fitted is provided in a bottom surface of the graphite crucible 91.

Figure 4C:
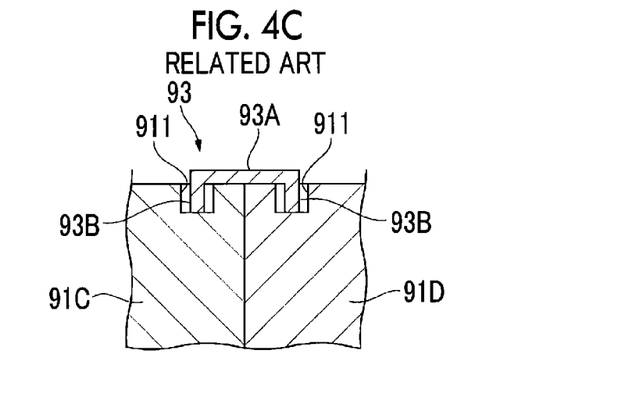
FIG. 4C is a partial cross-sectional view of the quartz crucible-supporting device in the related art.

Separation prevention members 93 are provided in upper surfaces of the divided graphite members 91C, 91D, and 91E to prevent the divided graphite members 91C, 91D, and 91E from separating from each other. As shown in FIG. 4C, the separation prevention member 93 includes a connection portion 93A with a rod shape, and pin portions 93B with a column shape which are provided at both ends of the connection portion 93A and are accommodated in pin support holes 911 with a circle shape of the divided graphite members 91C, 91D, and 91E. The inner diameter of the pin support hole 911 is larger than the outer diameter of the pin port ion 93B. The pin portion 93B is relatively movable in the pin support hole 911.

CITATION LIST

Patent Literature

[Patent Literature 1] Japanese Patent. Application No. 2000-264777 A

SUMMARY OF THE INVENTION

Problems to be Solved by the Invention

In the case of producing a silicon single crystal by using the crucible shown in FIGS. 4A, 4B, and 4C and the Czochralski process, firstly, the quartz crucible 221 is charged with a raw silicon material, and a silicon melt is produced by heating the quartz crucible 221 and the quartz crucible-supporting device with a heater. In the stage of producing this silicon melt, the quartz crucible 221, the graphite crucible 91, and the crucible-supporting pedestal 92 expand due to the heating. In the case where the quartz crucible 221 expands, the divided graphite members 91C, 91D, and 91E are pushed outward by the quartz crucible 221. At the time, until the pin portions 93B of the separation prevention members 93 relatively move in the pin support holes 911 to come into contact with the pin support holes 911, the divided graphite members 91C, 91D, and 91E separate from each other.

After the silicon melt is produced, the silicon single crystal is grown, and after this growth, in order to exchange the quartz crucible 221, the remainder of the silicon melt is solidified by cooling the inside of a chamber.

In this solidification stage, the silicon melt is solidified in an expanded state.

Figure 5A:
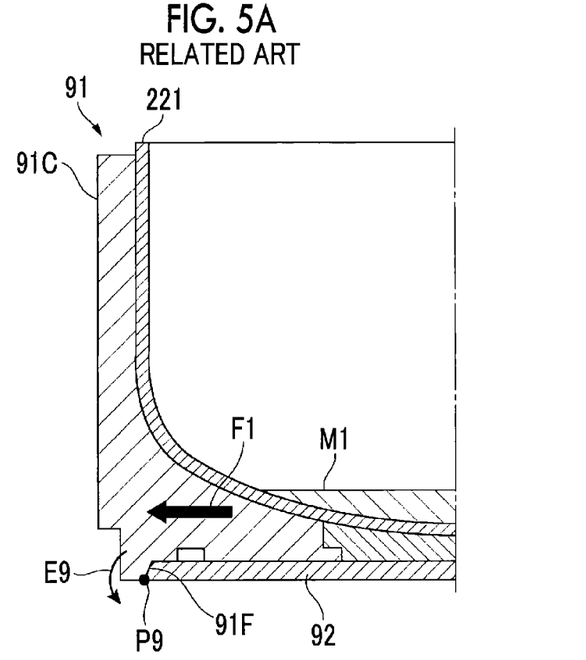
FIG. 5A is a view describing the action of the quartz crucible-supporting device in the related art.

On the other hand, due to the cooling, the quartz crucible 221 shrinks to return to the shape before the expansion. However, as shown in FIG. 5A, since the quartz crucible 221 accommodates a solidified product M1 which is more expanded than when the solidified product M1 is melted, at least an accommodating part of the quartz crucible 221 which accommodates the solidified product M1 cannot return to the state before the expansion.

Due to the cooling, the divided graphite members 91C, 91D, and 91E and the crucible-supporting pedestal 92 also shrink to return to the shapes before the expansion.

Since there is no obstacle to the shrinkage of the crucible-supporting pedestal 92, the crucible-supporting pedestal 92 is capable of returning to the shape before the expansion.

On the other hand, since the accommodating part of the quartz crucible 221 which accommodates the solidified product M1 cannot return to the shape before the expansion, when the divided graphite members 91C, 91D, and 91E shrink, a force F1 is applied outward to a part of each of the divided graphite members 91C, 91D, and 91E which is in contact with the accommodating part. A momentum E9 is produced by the force F1 to rotate upper ends of the divided graphite members 91C, 91D, and 91E1 around a contact area P9, which is the center of rotation and an area of contact between an opening edge of the recess portion 91F of the graphite crucible 91 and a lower end edge of the crucible-supporting pedestal 92, in a direction where the upper ends separate from each other.

Figure 5B:
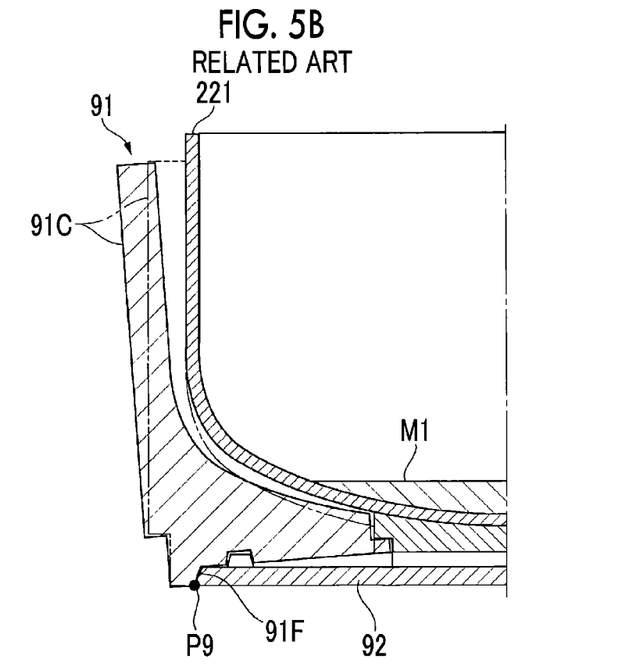
FIG. 5B is a view describing the action of the quartz crucible-supporting device in the related art.

As shown in FIG. 5B, due to the momentum E9, upper end sides of the divided graphite members 91C, 91D, and 91E are open to come into contact with the heater (not shown) which is provided outside the graphite crucible 91; and thereby, the heater is damaged, which is a concern.

An object of the present invention is to provide a crucible-supporting pedestal, a quartz crucible-supporting device including the crucible-supporting pedestal, and a method for producing a silicon single crystal by using the quartz crucible- supporting device which are capable of preventing upper ends of divided graphite members from being open when a silicon melt is solidified.

Means for Solving the Problems

According to an aspect of the present invention, there is provided a crucible-supporting pedestal that is attachable to a single crystal pulling-up apparatus using a Czochralski process, and supports a plurality of divided graphite members which are obtained by vertically dividing a graphite crucible which supports a quartz crucible, the pedestal including a fitting recess portion into which the plurality of divided graphite members are fittable, in which an opening edge of the fitting recess portion is formed such that a contact area between the opening edge and the plurality of divided graphite members is provided at a position higher than a surface of a solidified product of a silicon melt which remains in the quartz crucible after a silicon single crystal is grown, and a force, which is applied to the plurality of divided graphite members by an expansion of the silicon melt when the silicon melt is solidified, is applied to a position lower than the contact area.

According to the above aspect of the present invention, the force F1 which is applied, as shown in FIG. 5A, to the divided graphite members by the influence of the solidified product which is more expanded than when the solidified product is melted can be produced at a position lower than the contact area between the opening edge of the fitting recess portion of the crucible-supporting pedestal and the plurality of divided graphite members. Therefore, a momentum to rotate the plurality of divided graphite members around the contact area which is the center of rotation in a direction where the plurality of divided graphite member separate from each other can be prevented from being produced; and thereby, it is possible to prevent upper ends of the divided graphite members from being open According to an another aspect of the present invention, there is provided a crucible- supporting pedestal that is attachable to a single crystal pulling-up apparatus using a Czochralski process, and supports a plurality of divided graphite members which are obtained by vertically dividing a graphite crucible which supports a quartz crucible, the pedestal including a fitting recess portion into which the plurality of divided graphite members are fittable, in which when a depth of the fitting recess portion is A (mm), a thickness at a position in the plurality of divided graphite members which corresponds to a center of a bottom portion of the graphite crucible is B (mm), a thickness at a center of a bottom portion in the quartz crucible is C (mm), and a height of a solidified product of a silicon melt which remains in the quartz crucible after a silicon single crystal is grown is D (mm), the fitting recess portion is formed to satisfy the following inequality (1).

$$A > B + C + D \qquad (1)$$

According to still another aspect of the present invention, there is provided a crucible-supporting pedestal that is attachable to a single crystal pulling-up apparatus using a Czochralski process, and supports a plurality of divided graphite members which are obtained by vertically dividing a graphite crucible which supports a quartz crucible, the pedestal including a fitting recess portion into which the plurality of divided graphite members are fittable, in which when a depth of the fitting recess portion is A (mm), and a thickness at a position in the plurality of divided graphite members which corresponds to a center of a bottom portion of the graphite crucible is B (mm), the fitting recess portion is formed to satisfy the following ineqia;otu (2).

$$A > B + 45 \text{ mm} \qquad (2)$$

According to a further aspect of the present invention, there is provided a crucible-supporting pedestal that is attachable to a single crystal pulling-up apparatus using a Czochralski process, and supports a plurality of divided graphite members which are obtained by vertically dividing a graphite crucible which supports a quartz crucible, the pedestal including a fitting recess portion into which the plurality of divided graphite members are fittable, in which when a depth of the fitting recess portion is A (mm), and a thickness at a position in the plurality of divided graphite members which corresponds to a center of a bottom portion of the graphite crucible is B (mm), the fitting recess portion is formed to satisfy the following inequality (3).

$$A > B + 62 \text{ mm} \qquad (3)$$

According to a still further aspect of the present invention, there is provided a crucible-supporting pedestal that is attachable to a single crystal pulling-up apparatus using a Czochralski process, and supports a plurality of divided graphite members which are obtained vertically dividing a graphite crucible which supports a quartz crucible, the pedestal including a fitting recess portion into which the plurality of divided graphite members are fittable, in which when a depth of the fitting recess portion is A (mm), and a thickness at a position in the plurality of divided graphite members which corresponds to a center of a bottom portion the graphite crucible is B (mm), the fitting recess portion is formed to satisfy the following inequality (4).

$$A > B + 65 \text{ mm} \qquad (4)$$

According to a still further aspect of the present invention, there is provided a crucible-supporting pedestal that is attachable to a single crystal pulling-up apparatus using a Czochralski process, and supports a plurality of divided graphite members which are obtained by vertically dividing a graphite crucible which supports a quartz crucible, the pedestal including a fitting recess portion into which the plurality of divided graphite members are fittable, in which when a depth of the fitting recess portion is A (mm), and a thickness at a position in the plurality of divided graphite members which corresponds to a center of a bottom portion of the graphite crucible is B (mm), the fitting recess portion is formed to satisfy the following inequality (5).

$$A > B + 110 \text{ mm} \qquad (5)$$

In the case where the crucible-supporting pedestal which satisfies the inequality (2) is used in producing, for example, a silicon single crystal with a diameter of 150 mm, it is preferable that the thickness at the center of the bottom portion in the quartz crucible (hereinafter, may be referred to as "the thickness of the quartz crucible bottom portion") is from 6 mm to 15 mm. In general, a height of a solidified product of a silicon melt in producing the silicon single crystal with a diameter of 150 mm is from 10 mm to 30 mm. "45 mm" on the right side of the inequality (2) is the sum of 15 mm which is the maximum value of the thickness of the quartz crucible bottom portion and 30 mm which is the maximum value of the height of the solidified product.

In the case where the crucible-supporting pedestal which satisfies the inequality (3) is used in producing, for example, a silicon single crystal with a diameter of 200 mm, it is preferable that the thickness of the quartz crucible bottom portion is from 8 mm to 22 mm. In general, a height of a solidified product of a silicon melt in producing the silicon single crystal with a diameter of 200 mm is from 15 mm to 40 mm. "62 mm" on the right side of the inequality (3) is the sum of 22 mm which is the maximum value of the thickness the quartz crucible bottom portion and 40 mm which is the maximum value of the height of the solidified product.

In the case where the crucible-supporting pedestal which satisfies the inequality (4) is used in producing, for example, a silicon single crystal with a diameter of 300 mm, it is preferable that the thickness of the quartz crucible bottom portion is from 10 mm to 25 mm. In general, a height of a solidified product of a silicon melt in producing the silicon single crystal with a diameter of 300 mm is from 15 mm to 40 mm. "65 mm" on the right side of the inequality (4) is the sum of 25 mm which is the maximum value of the thickness of the quartz crucible bottom portion and 40 mm which is the maximum value of the height of the solidified product.

In the case where the crucible-supporting pedestal which satisfies the inequality (5) is used in producing, for example, a silicon single crystal with a diameter of 450 mm, it is preferable that the thickness of the quartz crucible bottom portion is from 15 mm to 30 mm. In general, a height of a solidified product of a silicon melt in producing the silicon single crystal with a diameter of 150 mm is from 20 mm to 80 mm. "110 mm" on the right side of the inequality (5) is the sum of 30 mm which is the maximum value of the thickness of the quartz crucible bottom portion and 80 mm which is the maximum value of the height of the solidified product.

According to the crucible-supporting pedestals of the present invention which satisfies the inequality (1), (2), (3), (4), and (5), the contact area between the opening edge of the fitting recess portion and the plurality of divided graphite members is provided at the position higher than the surface of the solidified product of the silicon melt which remains in the quartz crucible after the silicon single crystal is grown. Therefore, the force F1 which is applied, as shown in FIG. 5A, to the divided graphite members by the influence of the solidified product can be produced at a position lower than the contact area between the opening edge of the fitting recess portion of the crucible-supporting pedestal and the plurality of divided graphite members; and thereby, it is possible to prevent from upper ends of the graphite divided members from being open.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, in which an inner diameter of the graphite crucible before the graphite crucible is vertically divided is from 452 mm to 462 mm, and in which the B is from 12 mm to 20 mm, the C is from 6 mm to 15 mm, and the D is from 10 mm to 30 mm.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, in which an inner diameter of the graphite crucible before the graphite crucible is vertically divided is from 553 mm to 615 mm, and in which the B is from 15 mm to 35 mm, the C is from 8 mm to 22 mm, and the D is from 15 mm to 40 mm.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, in which an inner diameter of the graphite crucible before the graphite crucible is vertically divided is from 803 mm to 823 mm, and in which the B is from 20 mm to 45 mm, the C is from 10 mm to 25 mm, and the D is from 15 mm to 40 mm.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, in which an inner diameter of the graphite crucible before the graphite crucible is vertically divided is from 1,001 mm to 1,031 mm, and in which the B is from 25 mm to 55 mm, the C is from 15 mm to 30 mm, and the D is from 20 mm to 80 mm.

According to a stall further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, which an inner diameter of the graphite crucible before the graphite crucible is vertically divided is from 452 mm to 462 mm, and in which the B is from 12 ram to 20 mm.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, in which an inner diameter of the graphite crucible before the graphite crucible is vertically divided is from 553 mm to 615 mm, and in which the B is from 15 mm to 35 mm.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, in which an inner diameter of the graphite crucible before the graphite crucible is vertically divided is from 803 mm to 823 mm, and in which the B is from 20 mm to 45 mm.

According to a still further aspect of the present invention, there is provided a quartz crucible-supporting device including a plurality of divided graphite members which are obtained by vertically dividing a graphite crucible which supports a quartz crucible; and the above-described crucible-supporting pedestal which supports the plurality of divided graphite members, in which an inner diameter of the graphite crucible before the graphite crucible is vertically divided is from 1,001 mm to 1,031 mm, and in which the B is from 25 mm to 55 mm.

According to a still further aspect of the present invention, there is provided a method for producing a silicon single crystal that uses a quartz crucible and the above-described quartz crucible-supporting device which supports the quartz crucible, in which a silicon melt is solidified such that a surface of a solidified product of the silicon melt which remains in the quartz crucible after the silicon single crystal is grown is positioned lower than a contact area between the opening edge of the fitting recess portion and the plurality of divided graphite members.

According to the above aspects of the present invention, since the upper ends of the divided graphite members are prevented from being open when the silicon melt is solidified, it is possible to prevent a heater from being damaged.

DESCRIPTION OF THE EMBODIMENTS

Embodiment

Hereinbelow, an embodiment of the present invention will be described with reference to the drawings.
[Configuration of Quartz Crucible-Supporting Device]

Figure 1A:
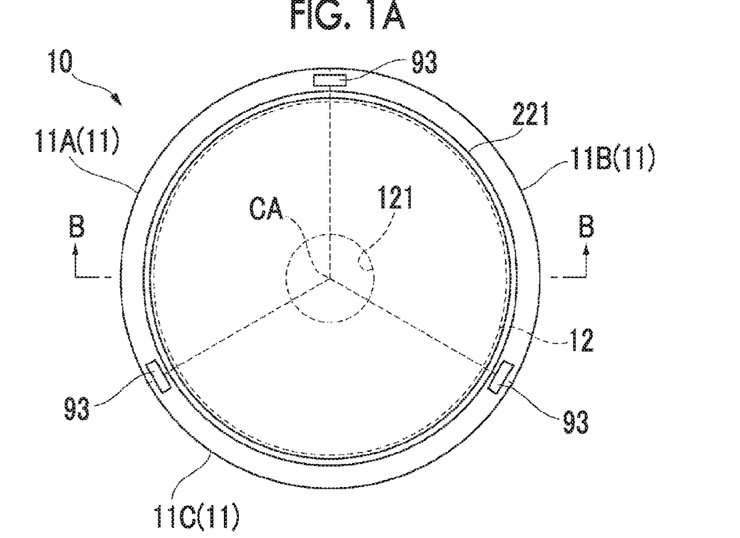
FIG. 1A is a plan view of a quartz crucible-supporting device in an embodiment of the present invention.
Figure 1B:
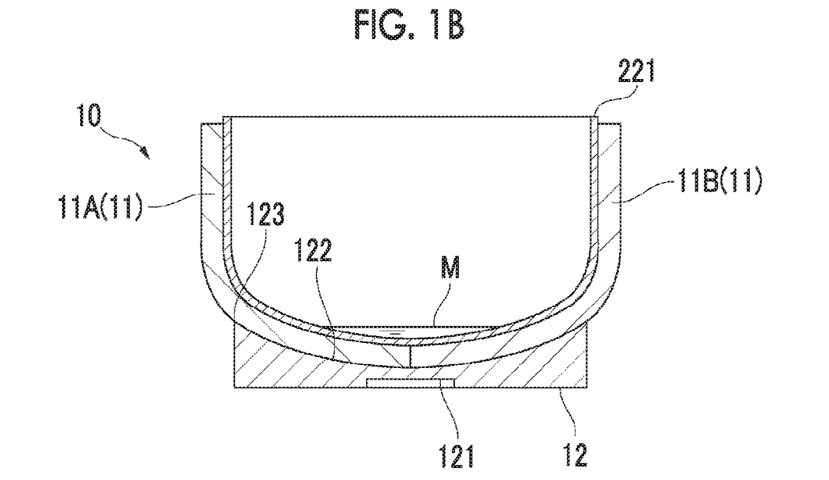
FIG. 1B is a cross-sectional view showing the quartz crucible-supporting device the embodiment, which is taken along a line B-B in FIG. 1A.
Figure 1C:
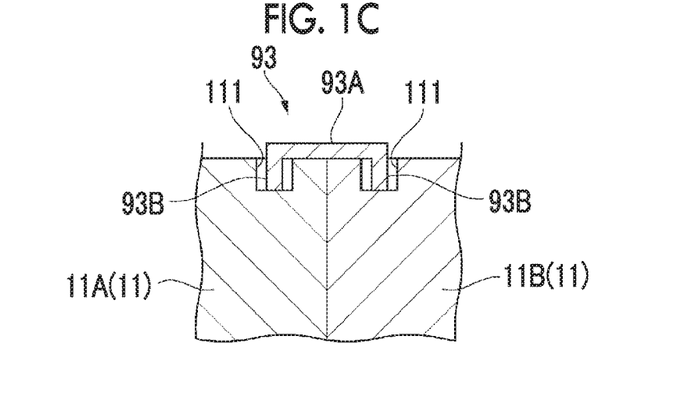
FIG. 1C is a partial cross-sectional view of the quartz crucible-supporting device in the embodiment.

As shown in FIGS. 1A and 1B, a quartz crucible-supporting device 10 supports a quartz crucible 221. The quartz crucible-supporting device 10 includes a first divided graphite member 11A, a second divided graphite member 11B, and a third divided graphite member 11C (hereinafter, may be collectively referred to a a "divided graphite member 11") which are obtained by vertically dividing a graphite crucible into three equal parts; a crucible-supporting pedestal 12 that supports the divided graphite member 11; and a separation prevention member 93 that prevents the divided graphite members 11A, 11B, and 11C from moving in a direction where the divided graphite members 11A, 11E, and 11C move away from a center CA of the quartz crucible 221 and separate from each other.

A pin support hole ill into which a pin portion 93B of the separation prevention member 93 is inserted is provided in an upper surface of the divided graphite member 11. The pin support hole 111 is formed such that when the pin portion 93B is inserted into the pin support hole 111, a gap is provided between the pin support hole 111 and the pin portion 93B.

The crucible-supporting pedestal 12 is made or graphite, and is formed into a circle shape in a plan view. A support shaft fitting groove 121 into which a support shaft. 25 is fitted is provided in one surface of the crucible-supporting pedestal 12.

Figure 2:
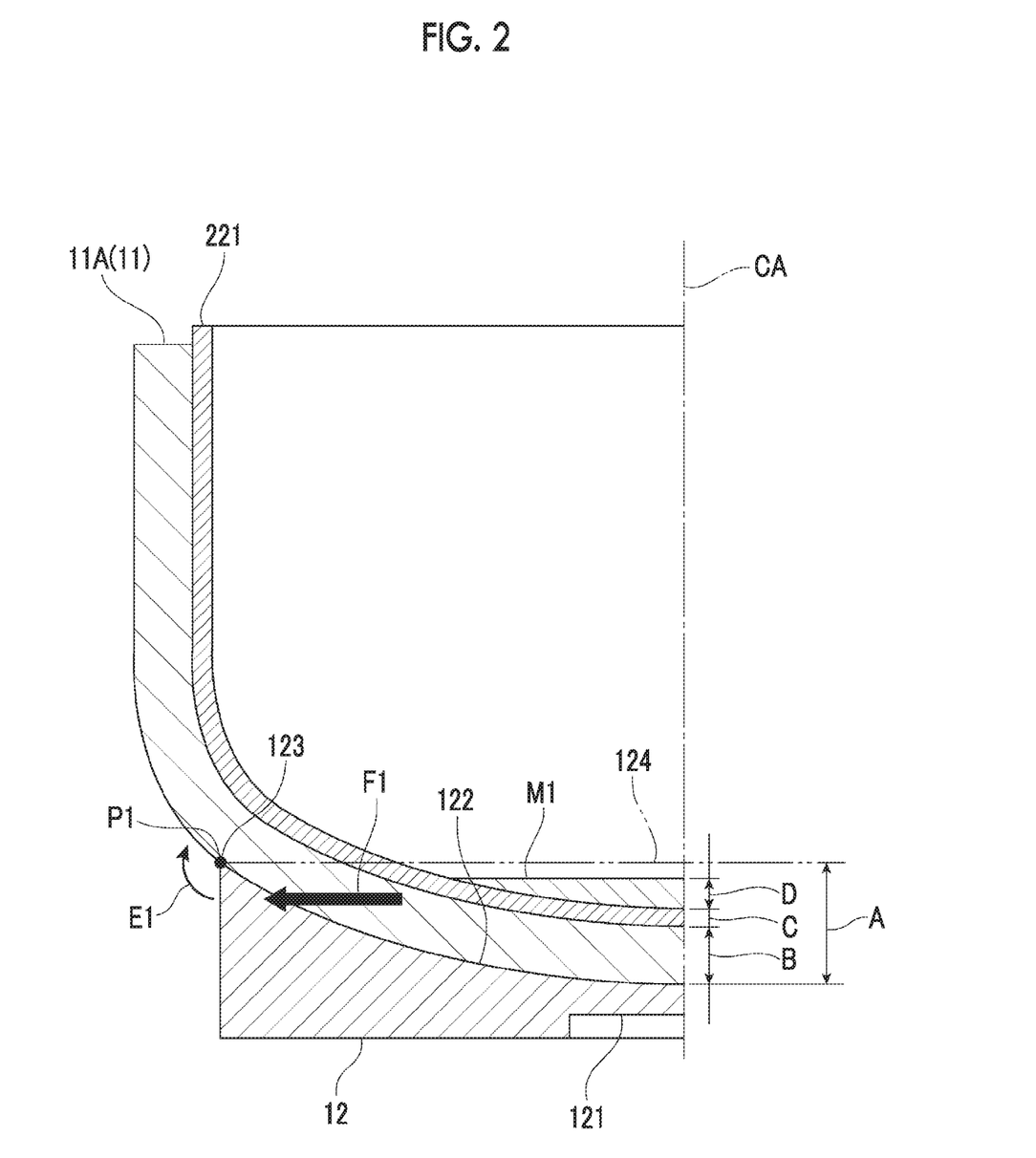
FIG. 2 is a view describing the action of the quartz crucible-supporting device in the embodiment.

A fitting recess portion 122 into which a lower portion of the divided graphite member 11 is fittable is provided in the other surface of the crucible-supporting pedestal 12. As shown in FIG. 2, when the depth of the fitting recess portion 122 (the distance from an opening plane 124 of the fitting recess portion 122 to the center of a bottom portion of the fitting recess portion 122) is A (mm), the thickness of the divided graphite member 11 at a position which corresponds to the center of a bottom portion of the graphite crucible before the graphite crucible is divided is B (mm), the thickness at the center of a bottom portion in the quartz crucible 221 is C (mm), the height of a solidified product M1 of a silicon melt M which remains in the quartz crucible 221 after a silicon single crystal is grown (the distance from the surface of the solidified product M1 to the center of the bottom portion of the quartz crucible 221) is D (mm) (hereinafter, referred to as a "height D of the solidified product), an opening edge 123 of the fitting recess portion 122 is formed to satisfy the following inequality (1).

It is preferable that an upper limit value of the depth A of the fitting recess portion 122 is set at a value where the opening edge 123 is positioned at the same height as that of an upper end of the divided graphite member 11 or is positioned lower than the upper end.

$$A > B + C + D \tag{1}$$

With this configuration satisfying the inequality (1), a contact area P1 between the opening edge 123 of the fitting recess portion 122 and the divided graphite members 11A, 11B, and 11C is positioned higher than the surface of the solidified product M1 of the silicon melt M after the silicon single crystal is grown.

In the case of growing a silicon single crystal which has a predetermined value of diameter after grinding an outer periphery of the silicon single crystal, it is preferable that the inner diameter of the graphite crucible before the graphite crucible is divided, the thickness B of the graphite crucible at the center of the bottom portion, the thickness C of the quartz crucible 221 at the center of the bottom portion, and the height D of the solidified product of the silicon melt are within the ranges shown in the following Table 1.

In the case where the diameter of the silicon single crystal is 150 mm, the crucible-supporting pedestal 12 may be formed to satisfy the following inequality (2), in the case where the diameter of the silicon single crystal is 200 mm, the crucible-supporting pedestal 12 may be formed to satisfy the following inequality (3), in the case where the diameter of the silicon single crystal is 300 mm, the crucible-supporting pedestal 12 may be formed to satisfy the following inequality (4), and in the case where the diameter of the silicon single crystal is 450 mm, the crucible-supporting pedestal 12 may be formed to satisfy the following inequality (5).

$$A > B + 45 \text{ mm} \tag{2}$$

$$A > B + 62 \text{ mm} \tag{3}$$

$$A > B + 65 \text{ mm} \tag{4}$$

$$A > B + 110 \text{ mm} \tag{5}$$

The inner diameters of the graphite crucible shown in Table 1 are the maximum inner diameters of the graphite crucible, and in the case where the graphite crucible includes a straight barrel portion (cylindrical portion with the same inner diameter at all positions in a height direction), the inner diameters are the inner diameters of the straight barrel portion.

The remaining amount of the silicon melt M after the silicon single crystal is grown is from 1% to 10% of the initial charge amount of a raw silicon material. The heights D of the solidified product shown in Table 1 are values when the silicon melts M which are equivalent to 1% to 10% of the initial charge amount are solidified.

TABLE 1

| Diameter of silicon single crystal (mm) | Inner diameter of graphite crucible | Thickness B at center of bottom portion in graphite crucible | Thickness C at center of bottom portion in quartz crucible | Height D of solidified product of silicon melt |
|---|---|---|---|---|
| 150 mm | From 452 mm to 462 mm (approximately 18 inch) | From 12 mm to 20 mm | From 6 mm to 15 mm | From 10 mm to 30 mm |
| 200 mm | From 553 mm to 615 mm (from approximately 22 inch to approximately 24 inch) | From 15 mm to 35 mm | From 8 mm to 22 mm | From 15 mm to 40 mm |
| 300 mm | From 803 mm to 823 mm (approximately 32 inch) | From 20 mm to 45 mm | From 10 mm to 25 mm | From 15 mm to 40 mm |
| 450 mm | From 1,001 mm to 1,031 mm (approximately 40 inch) | From 25 mm to 55 mm | From 15 mm to 30 mm | From 20 mm to 80 mm |

[Method for Producing Silicon Single Crystal]

A method for producing a silicon single crystal by the Czochralski process using the quartz crucible-supporting device 10 will be described.

Figure 3:
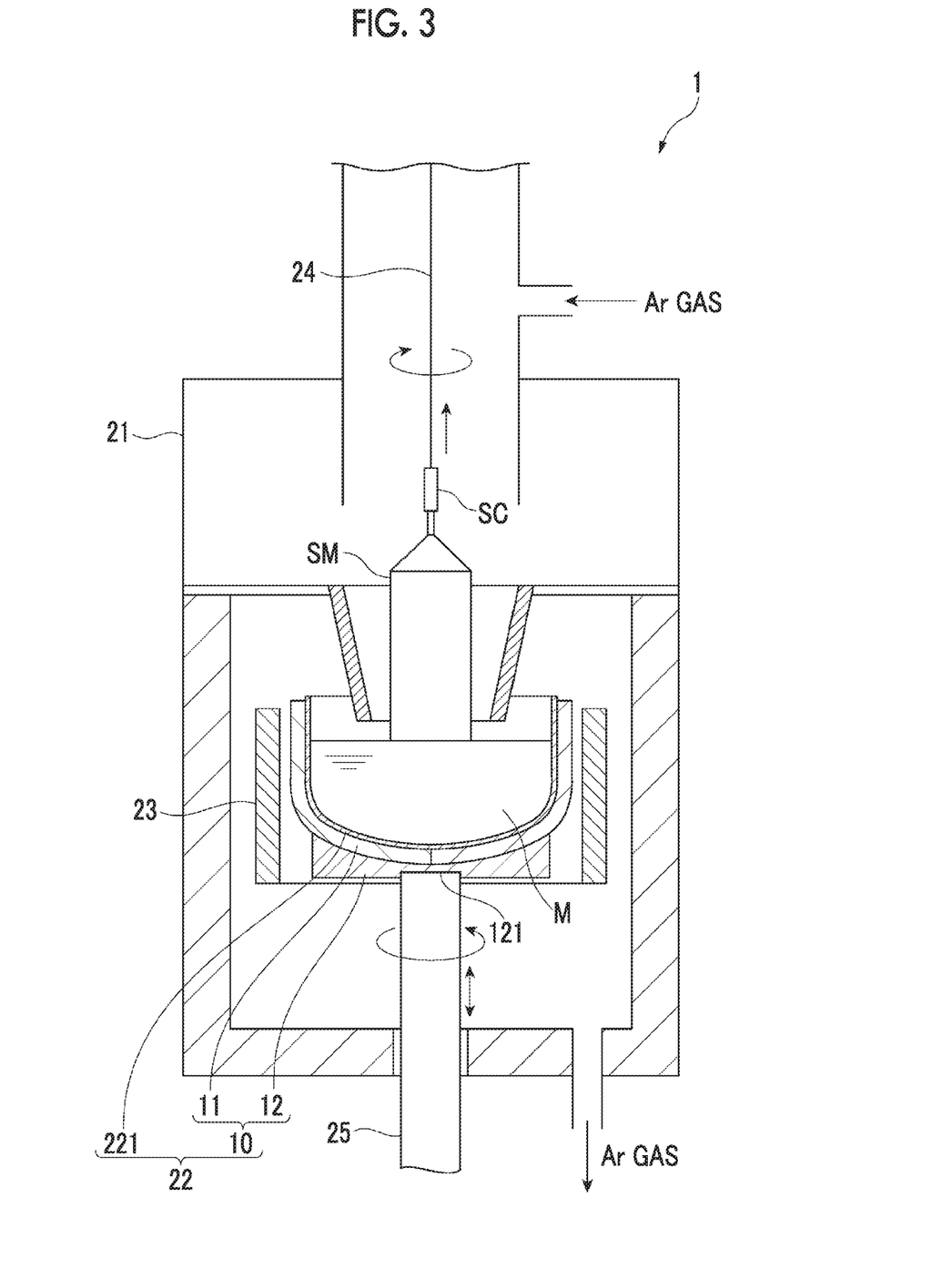
FIG. 3 is a schematic view showing the configuration of a single crystal pulling-up apparatus in the embodiment.

As shown in FIG. 3, the quartz crucible 221 is supported on the quartz crucible-supporting device 10 in a chamber 21 of a single crystal pulling-up apparatus 1 (hereinafter, the quartz crucible 221 and the quartz crucible-supporting device 10 may be collectively referred as a "crucible 22"), and the quartz crucible 221 is charged with a raw silicon solid material. The raw silicon material in the crucible 22 is melted to produce the silicon melt M by heating the crucible 22 with a heater 23.

In the case where the silicon melt M is produced, the quartz crucible 221, the divided graphite member 11, and the crucible-supporting pedestal 12 expand due to the heating. The divided graphite members 11A, 11B, and 11C are pushed outward by the quartz crucible 221 which is expanded, and until the pin portions 93B of the separation Prevention members 93 relatively move in the pin support holes 111 to come into contact with the pin support holes 111, the divided graphite members 11A, 11B, and 11C separate from each other.

After the silicon melt M is produced, the chamber 21 is maintained in an inert atmosphere under reduced pressure by introducing an argon gas into the chamber 21, and after while the crucible 22 is rotated by driving the support shaft 25, a seed crystal SC is brought into contact with the silicon melt M, a silicon single crystal SM is grown by pulling up the seed crystal SC with a pulling-up cable 24.

After the silicon single crystal SM is grown, in order to exchange the quartz crucible 221, the remainder of the silicon melt M is solidified by cooling the inside of the chamber 21.

At the time, as described above, the silicon melt M is solidified in the state of being more expanded than when the silicon melt M is melted.

On the other hand, the quartz crucible 221 shrinks to return to the shape before the expansion; however, since the quartz crucible 221 accommodates the solidified product M1 which is more expanded than when the solidified product M1 is melted, at least an accommodating part of the quartz crucible 221 which accommodates the solidified product M1 cannot return to the state before the expansion.

Since there is no obstacle to the shrinkage of the crucible-supporting pedestal 12, the crucible-supporting pedestal 12 is capable of returning to the shape before the expansion.

However, since the accommodating part of the quartz crucible 221 which accommodates the solidified product M1 cannot return to the state before the expansion, as shown in FIG. 2, when the divided graphite members 11A, 11B, and 11C shrink, a force F1 is applied outward to a part of each of the divided graphite members 11A, 11B, and 11C which is in contact with the accommodating part. At the time, since the contact area P1 is positioned higher than the surface of the solidified product M1 of the silicon melt M, a momentum E1 is produced by the force F1 to rotate upper ends of the divided graphite members 11A, 11B, and 11C around the contact area P1, which is the center of rotation, in a direction where the upper ends approach each other. Due to the momentum E1, upper end sides of the divided graphite members 11A, 11B, and 11C are prevented from being open; and thereby, it is possible to prevent the divided graphite members 11A, 11B, and 11C from causing damage to the heater 23.

Modification Example

The present invention is not limited to only the above-described embodiment, and various improvements, design changes, or the like can be made to the present invention without departing from the concept of the present invention.

For example, a divided support member may have a shape which is obtained by vertically dividing the graphite crucible into two equal parts or four equal parts.

The invention claimed is:

1. A crucible-supporting pedestal that is attachable to a single crystal pulling-up apparatus for growing a single crystal from a silicon melt using a Czochralski process, and supports a plurality of divided graphite members which are obtained by vertically dividing a graphite crucible which supports a quartz crucible, the quartz crucible having a level at which level remaining silicon melt is solidified following operation, the crucible-supporting pedestal comprising:

a fitting recess portion into which the plurality of divided graphite members are fittable, wherein an opening edge of the fitting recess portion is formed such that a contact area between the opening edge and the plurality of divided graphite members is provided at a position higher than the level at which level remaining silicon melt is solidified such that a force, which is applied to the plurality of divided graphite members by an expansion of remaining silicon melt in the case that the silicon melt is solidified, is applied to a position lower than the contact area.

2. The crucible-supporting pedestal according to claim 1, wherein in a case that a depth of the fitting recess portion is A (mm),
a thickness at a position in the plurality of divided graphite members which corresponds to a center of a bottom portion of the graphite crucible is B (mm),
a thickness at a center of a bottom portion in the quartz crucible is C (mm), and
a height above the center of the bottom portion in the quartz crucible of the level at which level remaining silicon melt is solidified is D (mm), the fitting recess portion is formed to satisfy the following inequality (1):

$$A > B+C+D \qquad (1).$$

3. A quartz crucible-supporting device comprising:
the crucible-supporting pedestal according to claim 2 which supports the plurality of divided graphite members, and
the plurality of divided graphite members which are obtained by vertically dividing the graphite crucible which supports the quartz crucible;
wherein an inner diameter of the graphite crucible before the graphite crucible is vertically divided is from 452 mm to 462 mm, and
wherein the B is from 12 mm to 20 mm, the C is from 6 mm to 15 mm, and the D is from 10 mm to 30 mm.

4. A quartz crucible-supporting device comprising:
the crucible-supporting pedestal according to claim 2 which supports the plurality of divided graphite members, and
the plurality of divided graphite members which are obtained by vertically dividing the graphite crucible which supports the quartz crucible;
wherein an inner diameter of the graphite crucible before the graphite crucible is vertically divided is from 553 mm to 615 mm, and
wherein the B is from 15 mm to 35 mm, the C is from 8 mm to 22 mm, and the D is from 15 mm to 40 mm.

5. A quartz crucible-supporting device comprising:
the crucible-supporting pedestal according to claim 2 which supports the plurality of divided graphite members, and
the plurality of divided graphite members which are obtained by vertically dividing the graphite crucible which supports the quartz crucible;
wherein an inner diameter of the graphite crucible before the graphite crucible is vertically divided is from 803 mm to 823 mm, and
wherein the B is from 20 mm to 45 mm, the C is from 10 mm to 25 mm, and the D is from 15 mm to 40 mm.

6. A quartz crucible-supporting device comprising:
the crucible-supporting pedestal according to claim 2 which supports the plurality of divided graphite members, and
the plurality of divided graphite members which are obtained by vertically dividing the graphite crucible which supports the quartz crucible;
wherein an inner diameter of the graphite crucible before the graphite crucible is vertically divided is from 1,001 mm to 1,031 mm, and
wherein the B is from 25 mm to 55 mm, the C is from 15 mm to 30 mm, and the D is from 20 mm to 80 mm.

7. The crucible-supporting pedestal according to claim 1, wherein in a case that depth of the fitting recess portion is A (mm), and
a thickness at a position in the plurality of divided graphite members which corresponds to a center of a bottom portion of the graphite crucible is B (mm), the fitting recess portion is formed to satisfy the following equation (2):

$$A > B+45 \text{ mm} \qquad (2).$$

8. A quartz crucible-supporting device comprising:
the crucible-supporting pedestal according to claim 7 which supports the plurality of divided graphite members, and
the plurality of divided graphite members which are obtained by vertically dividing the graphite crucible which supports the quartz crucible;
wherein an inner diameter of the graphite crucible before the graphite crucible is vertically divided is from 452 mm to 462 mm, and
wherein the B is from 12 mm to 20 mm.

9. The crucible-supporting pedestal according to claim 1, wherein in a case that depth of the fitting recess portion is A (mm), and
a thickness at a position in the plurality of divided graphite members which corresponds to a center of a bottom portion of the graphite crucible is B (mm), the fitting recess portion is formed to satisfy the following equation (3):

$$A > B+62 \text{ mm} \qquad (3).$$

10. A quartz crucible-supporting device comprising:
the crucible-supporting pedestal according to claim 4 which supports the plurality of divided graphite members, and
the plurality of divided graphite members which are obtained by vertically dividing the graphite crucible which supports the quartz crucible;
wherein an inner diameter of the graphite crucible before the graphite crucible is vertically divided is from 553 mm to 615 mm, and
wherein the B is from 15 mm to 35 mm.

11. The crucible-supporting pedestal according to claim 1, wherein in a case that depth of the fitting recess portion is A (mm), and
a thickness at a position in the plurality of divided graphite members which corresponds to a center of a bottom portion of the graphite crucible is B (mm), the fitting recess portion is formed to satisfy the following equation (4):

$$A > B+65 \text{ mm} \qquad (4).$$

12. A quartz crucible-supporting device comprising:
the crucible-supporting pedestal according to claim 5 which supports the plurality of divided graphite members, and
the plurality of divided graphite members which are obtained by vertically dividing the graphite crucible which supports the quartz crucible;

wherein an inner diameter of the graphite crucible before the graphite crucible is vertically divided is from 803 mm to 823 mm, and wherein the B is from 20 mm to 45 mm.

13. The crucible-supporting pedestal according to claim 1, wherein in a case that depth of the fitting recess portion is A (mm), and a thickness at a position in the plurality of divided graphite members which corresponds to a center of a bottom portion of the graphite crucible is B (mm), the fitting recess portion is formed to satisfy the following equation (5):

$$A>B+110 \text{ mm} \tag{5}$$

14. A quartz crucible-supporting device comprising:

the crucible-supporting pedestal according to claim 6 which supports the plurality of divided graphite members, and the plurality of divided graphite members which are obtained by vertically dividing the graphite crucible which supports the quartz crucible;

wherein an inner diameter of the graphite crucible before the graphite crucible is vertically divided is from 1,001 mm to 1,031 mm, and wherein the B is from 25 mm to 55 mm.

15. A quartz crucible-supporting device comprising:

the crucible-supporting pedestal according to claim 1 which supports the plurality of divided graphite members, and the plurality of divided graphite members which are obtained by vertically dividing the graphite crucible which supports the quartz crucible.

16. A method for producing a silicon single crystal that uses the quartz crucible and the quartz crucible-supporting device according to claim 15 which supports the quartz crucible, wherein the silicon melt is solidified such that a surface of the solidified product of the silicon melt which remains in the quartz crucible after the silicon single crystal is grown is positioned lower than the contact area between the opening edge of the fitting recess portion and the plurality of divided graphite members.

* * * * *